United States Patent [19]

Schijven

[11] 3,964,000
[45] June 15, 1976

[54] PUSHBUTTON DEVICE FOR MECHANICAL PRESELECTION TUNING

[75] Inventor: Lucas Wilhelmus Martinus Schijven, Eindhoven, Netherlands

[73] Assignee: U.S. Philips Corporation, Briarcliff Manor, N.Y.

[22] Filed: Jan. 7, 1975

[21] Appl. No.: 539,118

[30] Foreign Application Priority Data
Feb. 1, 1974 Netherlands.................... 7401404

[52] U.S. Cl.................................. 334/7; 74/10.33; 334/74
[51] Int. Cl.²....................... H03J 5/06; H03J 5/08; H03J 5/32
[58] Field of Search................ 334/7, 74; 74/10.33

[56] References Cited
UNITED STATES PATENTS

| | | |
|---|---|---|
| 3,634,791 | 1/1972 | Urawa-shi et al...................... 334/7 |
| 3,635,097 | 1/1972 | Mears, Jr............................... 334/7 |
| 3,636,776 | 1/1972 | Grandin................................. 334/7 |
| 3,648,526 | 3/1972 | Repay.................................... 334/7 |
| 3,832,907 | 9/1974 | Yasuda................................... 334/7 |

Primary Examiner—Saxfield Chatmon, Jr.
Attorney, Agent, or Firm—Frank R. Trifari; David R. Treacy

[57] ABSTRACT

A pushbutton device for preselection tuning in radio receivers, having an adjusting member journalled to be rotatable in a frame of the receiver for engagement by preselection discs and for controlling tuning coils. A manual tuning knob is connected to the member by a slip coupling. The adjusting member forms, together with the slip coupling, a rotatable unit which consists of two portions which are separated by the slip coupling, each portion being supported in a bearing so as to require only a small preselection force.

4 Claims, 7 Drawing Figures

3,964,000

PUSHBUTTON DEVICE FOR MECHANICAL PRESELECTION TUNING

BACKGROUND OF THE INVENTION

1. Field of the Invention

The invention relates to a pushbutton device for mechanical preselection tuning in radio receivers, and more particularly to a device comprising a mainly rectangular adjusting member which is rotatable about its longitudinal axis and which is coupled to the tuning means of the receiver. Such a member can be driven, by way of a slip coupling, by a tuning control or knob and, moreover, directly by cooperation with preselection discs which are adjustably and fixably provided on the slide rods of the pushbuttons, the adjusting member and the slip coupling constituting an elongate unit which is rotatable as one assembly and which is journalled in the frame of the receiver near its two ends.

Preselection tuning is effected by depressing one of the buttons so far that the straight edge of the associated, approximately semi-circular preselection disc abuts against the adjusting member and forces the latter to take over the rotary position of the disc which corresponds to a preselected station. Thanks to the presence of the slip coupling between the adjusting member and the tuning knob with associated gearwheel or worm wheel transmission, the rotation of the adjusting member takes place without the elements of the transmission being rotated.

2. Description of the Prior Art

In known devices of this kind (see for example, German Gebrauchsmuster No. 1,835,052), the adjusting member has rigidly connected thereto one or two shaft stubs which are journalled in the frame of the receiver, the slip coupling, usually consisting of a disc and a gearwheel or a worm wheel, being arranged on one of these shaft stubs. The moment of slip — i.e. the turning moment at which the coupling starts to slip, which is also the largest moment which can be transmitted — should be sufficient to overcome, when the tuning control is turned, the friction in the two bearings of the adjusting member and the friction of the tuning means — usually slide cores — driven by this member. On the other hand, the moment of slip should be as small as possible because, when a pushbutton is depressed, the tuning knob is stationary and — besides the said frictions — the moment of slip must be overcome.

SUMMARY OF THE INVENTION

The object of the invention is to make it easier to satisfy the two contradictory requirements of high transmitted torque for manual tuning and low clutch drag during preselections.

According to the invention, the rotatable unit formed by the adjusting member and the slip coupling consists of two portions which are separated by the slip coupling, each of the said portions being supported in only one of the two bearings. As will yet be described, disregarding the friction of the portions to be driven, the moment of slip need only be large enough to overcome the friction in one of the two bearings of the adjusting member, and the required button pressure is less, not only thanks to the smaller moment of slip, but also because when a button is depressed, besides the moment of slips only the friction in one bearing need be overcome.

The invention will be described in detail hereinafter with reference to the drawing.

Figure 1:
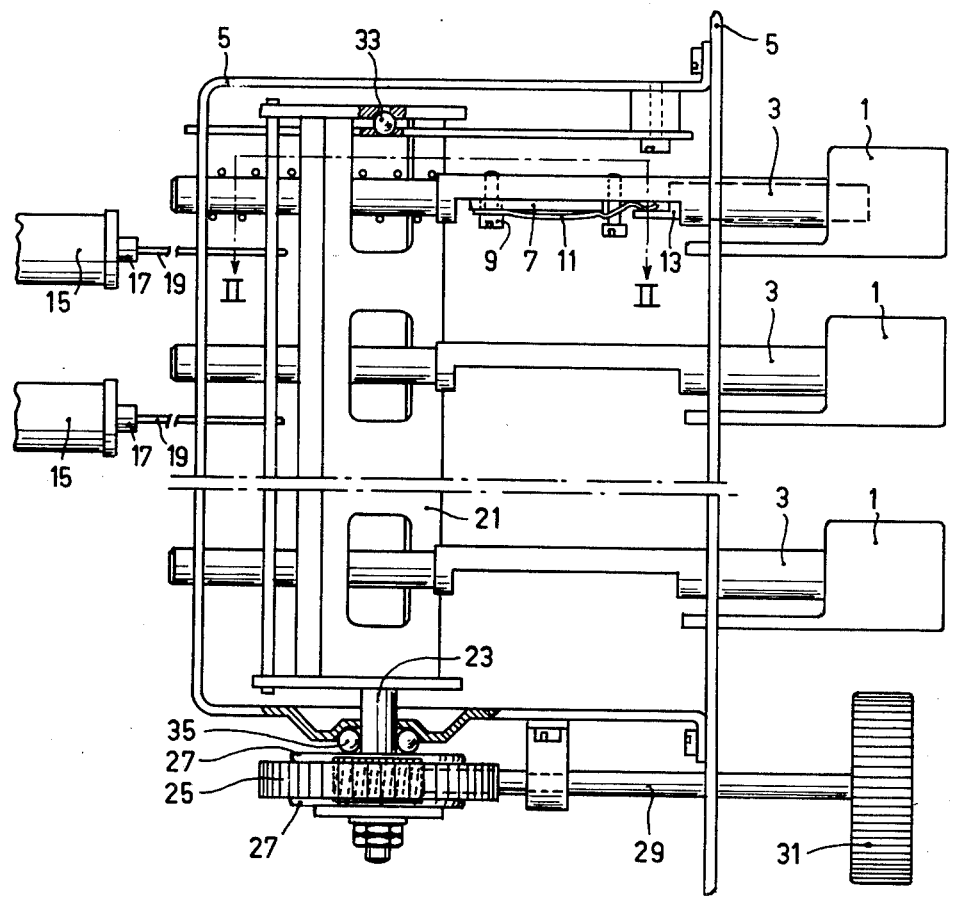
FIGS. 1 and 2 show a known pushbutton.
Figure 2:
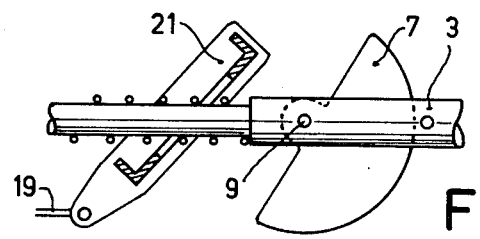

The known device shown in the FIGS. 1 and 2 comprises a number of pushbuttons 1 provided on button rods 3 which are round along most of their length in the present case and which are journalled to be axially slidable in a frame 5. Each of the button rods 3 supports an approximately semi-circular disc 7 which is rotatable about a shaft bolt 9 and which can be fixed in any rotary position by means of a leaf spring 11 (see FIG. 1). One end of the leaf spring 11 is attached underneath the head of the bolt 9, while the other end is tensioned by a portion 13 of the button rod 3 which can be slid out by means of knob 1. A portion of the leaf spring 11 which is situated between the ends serves for rigidly clamping the curved edge of the disc 7.

The device shown forms part of a radio receiver comprising slide core coils 15, the cores 17 of which are coupled, via resilient wires 19, to a mainly rectangular adjusting member 21 which is rotatable about its longitudinal axis. This member is provided on one end with a shaft stub 23 on which there is provided a freely rotatable worm wheel 25 between two discs 27 which are resiliently pressed towards each other and which constitute a slip coupling in conjunction with the wheel 25. The slide cores 17 can be driven by the adjusting member 21 which is in turned rotated by the worm wheel 25, through said slip coupling. The worm wheel is driven by a worm on a shaft 29, having a turning knob 31 thereon.

A second possibility for driving the slide cores 17 is the depression of one of the pushbuttons 1. The straight edges of the associated semi-circular disc 7 (preselection disc) then abut against the adjusting member 21 and force the latter to take over the (preselected) rotary position of the disc 7. Thanks to the slip coupling 25, 27, the rotation of the adjusting member 21 is possible in spite of the fact that the worm wheel 25 remains stationary. The selection of the rotary position of the disc 27 (preselection is effected, after the tuning to the desired station by means of the knob 31, by pulling out the pushbutton 1, with the result that the retained end of the leaf spring 11 is released and the clamping of the preselection disc 7 is temporarily removed, and by subsequently depressing the button 1 again until the now freely rotatable disc 7 in its turn takes over the position of the adjusting member 21, after which the disc is fixed in this position by complete depression of the button 1.

It will be obvious that the moment of slip (the maximum turning moment which can be transmitted by the coupling 25, 27) should be large enough to overcome, in addition to the friction of the slide cores 17 in the coils 15, the friction in the two bearings 33 and 35 of the adjusting member 21. As will yet be described, the friction is substantial, particularly in the main bearing 35 if the latter is not constructed as a ball bearing but as a much cheaper sleeve bearing, which may imply an inadmissibly high required button pressure, because the latter must overcome the moment of slip and inter alia also the friction in both bearings. In the device described hereinafter the friction of the main bearing need be overcome neither by the button pressure nor by the moment of slip.

Figure 3:
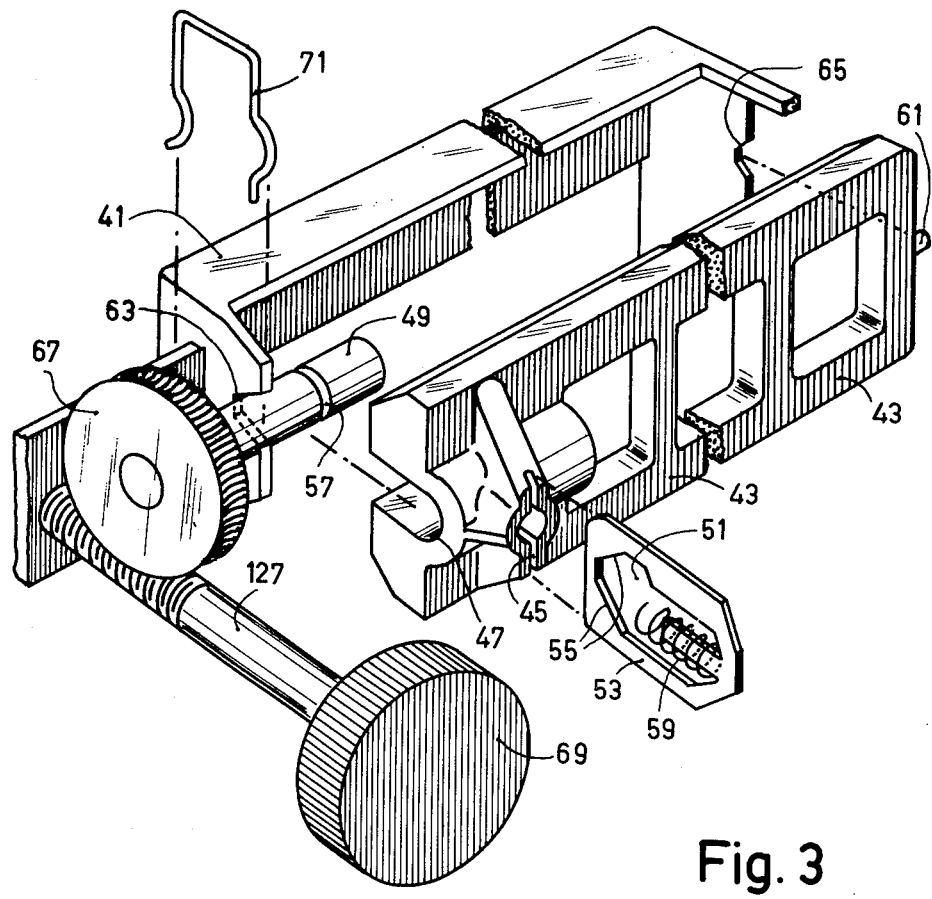
FIG. 3 is a perspective exploded view of the principal manual and preselect tuning members of an embodiment according to the invention.
Figure 4:
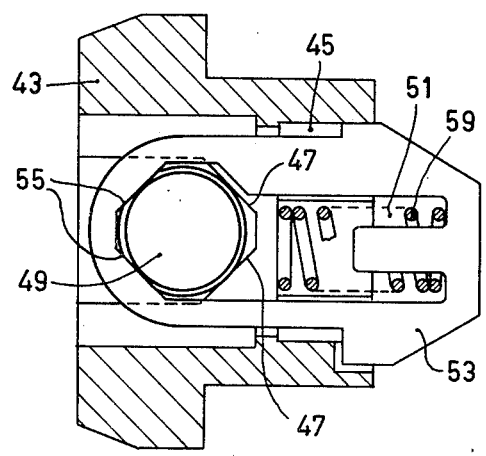
FIGS. 4 and 5 are a cross-sectional view and view transverse to the shaft, respectively, of a detail of the device shown in FIG. 3, and FIGS. 6 and 7 are a rear perspective view and a cross-sectional view, respectively, of a complete device embodying the invention illustrated in the FIGS. 3–5.
Figure 5:
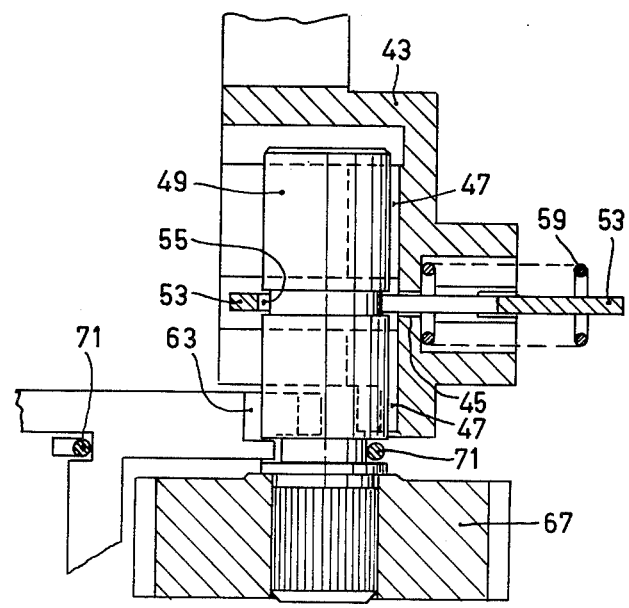

FIGS. 3, 4 and 5 show an adjusting member according to the invention and the journalling thereof in the frame 41 of the receiver (shown in simplified form). The present rectangular adjusting member 43 is an injection molding having a V-shaped longitudinal groove 47 which is interrupted by a transverse slot 45. A steel shaft stub 49 is accommodated in the groove 47 (shown outside the member 43 in FIG. 3 for the sake of clarity). The shaft stub 49 is inserted through an elongate cut-off recess 51 of a plate-like yoke 53 previously inserted through the transverse slot 45. The cut-out 51 comprises a V-shaped portion 55 on one end. An adjoining internally V-shaped portion of the yoke 53 engages a circular groove 57 of the shaft stub 49, the groove having a width which is adapted to the thickness of the yoke 53. Accommodated in the cutout 51 is a compression spring 59 which acts on the adjusting member 43 on the one side and on the other side, via the yoke 53, on the shaft stub 49 to keep the latter pressed on the V-groove 47 of the member 43. The components 43, 49, 53 and 59 together constitute a simple slip coupling, the moment of slip of which is dependent inter alia on the force of the compression spring 59.

As shown in FIGS. 3 and 4, the compression spring 59 is preferably arranged in a laterally shifted position with respect to the V-shaped portion 55 of the cut-out 51, and hence also with respect to the shaft stub 49. The spring 59 thus exerts a tilting force on the yoke 53, with the result that this yoke laterally abuts, inside the adjusting member 43, against one of the narrow sides (against the upper side in the figures) of the transverse slot 45; this is desirable in order to prevent any backlash in the slip coupling.

As appears from FIG. 3, the shaft stub 49 and the stationary shaft stub 61 formed on the other end of the adjusting member 43 are journalled in V-shaped grooves 63 and 65, respectively, of the frame 41. The slip coupling 49-59 is situated between the two bearings such that the elongate unit, which is rotatable as one assembly and which is formed by the adjusting member 43 and the slip coupling including the shaft stub 49, consists of two portions which are separated by the slip coupling, i.e. the member 43, and the shaft stub 49; each of these is supported in one of the two bearings 65 and 63. This situation clearly differs from that shown in the FIGS. 1 and 2, in which the portion of the rotatable unit which is situated between the two bearings 33 and 35 is not interrupted by the slip coupling.

As a result, during the rotation of the adjusting member 43, when a pushbutton is depressed (not shown in FIG. 3 for the sake of clarity), the shaft stub 49 remains stationary. This is in contrast with the shaft stub 23 of FIG. 1. This means that, disregarding the friction of the components such as slide cores, etc. to be driven by the member 43, besides the moment of slip only the friction of the shaft stub 61 in the bearing 65 need be overcome when a button is depressed. A second consequence is that the moment of slip, as already noted, need be calculated only to overcome the friction of the components to be driven and of the bearing 61, 65. The force required for overcoming the friction in the main bearing 49, 63 is directly delivered by the tuning knob 69, via the worm wheel 67 connected to the shaft stub 49. The total saving as regards required button pressure with respect to the device shown in FIGS. 1 and 2 thus corresponds to twice the friction in the main bearing.

The fact that the stub 49 is stationary during tuning by means of pushbuttons makes it readily possible to use an inexpensive sleeve bearing for the main bearing in the manner shown. The friction in this bearing is comparatively high, because the shaft stub 49 is to be maintained pressed in the V-shaped cut-out 63 by a wire spring 71 at a force which is adequate to overcome the forces opposing the force of the wire spring, notably those which can occur during the rotation of the knob 69. The fact that the comparatively high friction in the main bearing 49, 63 must be overcome during the rotation of the knob 69 was not found to be objectionable in practice.

Figure 7:
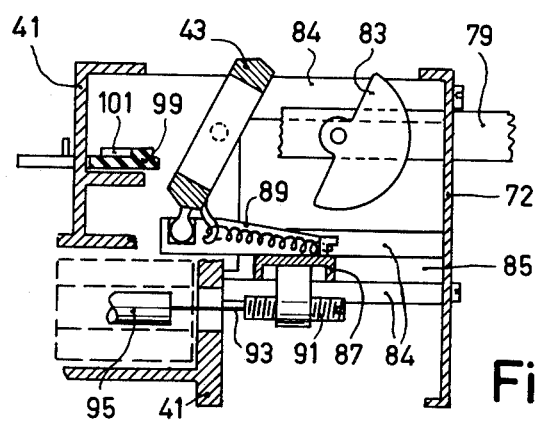

The frame in which the rotatable unit 43, 49 is journalled consists of the aforementioned more or less troughshaped injection molding 41 on which a plate-like metal portion 72 (FIGS. 6 and 7) is screwed down. In the frame portion 41 there are formed the two V-shaped bearings 63 and 65 (see FIG. 3; not visible in the FIGS. 6 and 7) for the unit 43, 49, compartments 73 for the slide core tuning coils 75, and guide grooves 77 for the slide rods 79 of the pushbuttons 81 (only one thereof is shown for the sake of clarity, while the associated preselection disc 83, visible in FIG. 7, is omitted in FIG. 6).

The frame portion 41 comprises four integral legs 84 which extend perpendicular to the plate 72 and which serve for the plate 72. The lower two legs 84 in the drawing (one is visible in FIG. 7) are provided with a longitudinal groove 85 which serves as a guide for a mainly rodlike slide 87 which is parallel to the plate 72 and which is movable perpendicular thereto and driven without play, via an integral coupling piece 89, by the adjusting member 43 (see FIG. 7) and which in turn drives, via adjusting screws 91 and resilient metal wires 93, the slide cores 95 of the coils 75.

Figure 6:
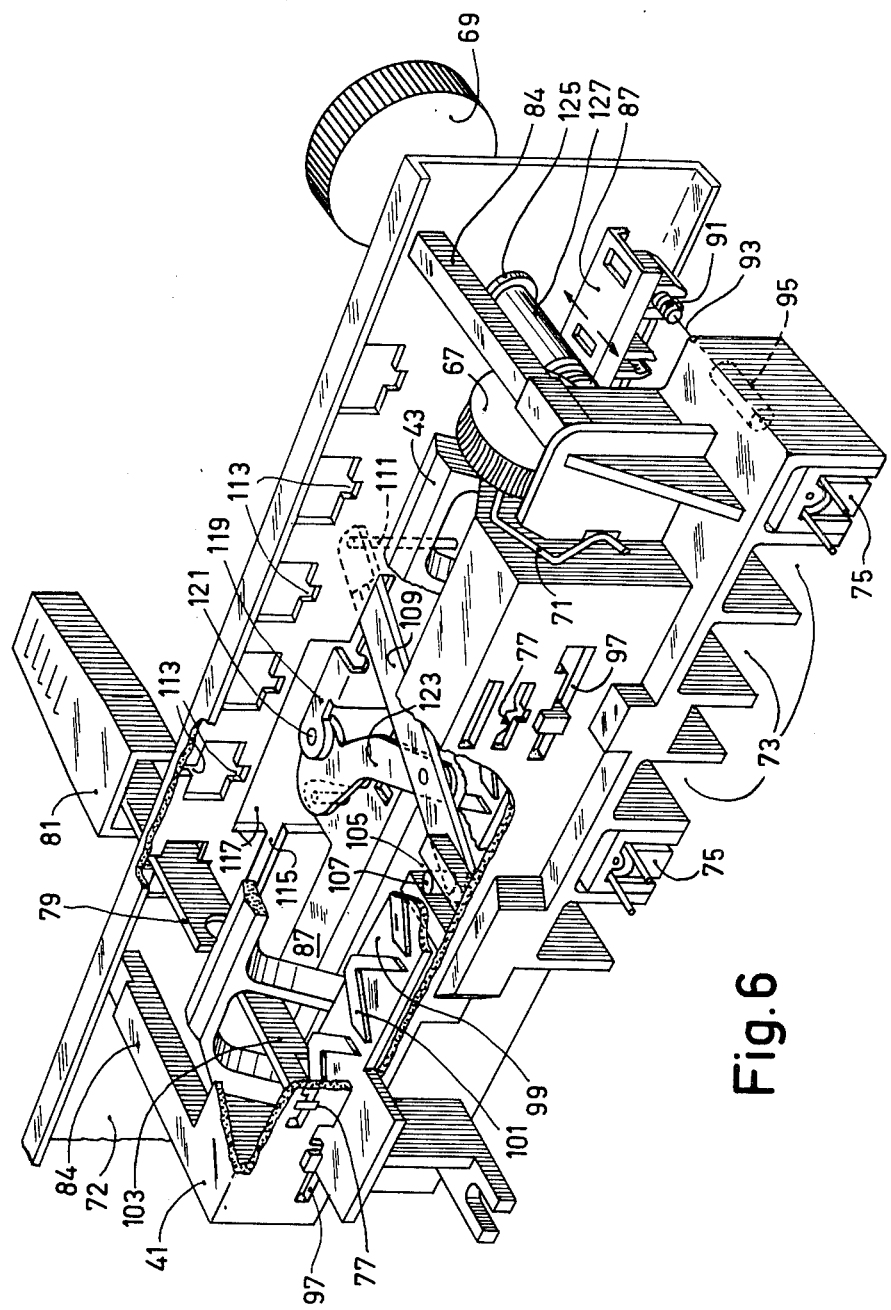

In the bottom portion of the trough-like frame portion 41 there are provided guide grooves 97 for a strip-shaped slide 99 which has a zigzag-shaped raised portion 101 on the upper side as shown in FIG. 6; by cooperation of the bevelled edges of this raised portion with cams 103 on the slide rods 79, predetermined shifts of the slide 99 parallel to the plate 72 are effected when each of the slide rods is depressed. These shifts corresponds to the positions of the wave range switch of the receiver (not shown) which is mechanically coupled to the slide 99.

Finally, the frame portion 41 comprises a sliding groove 105 in which a hinge pin 107 can slide perpendicular to the plate 72. The pin 107 is provided on one end of a lever 109 which supports on its other end a scale indicator 111 and which forms part of a known lever system for the approximately linear movement of a scale indicator, the system being coupled to the slide 87.

As is shown in FIG. 6, the elongate plate 72 is provided with guide grooves 113 for the button rods 79 and a longitudinal groove 115, comprising a widened central portion 117, for the passage of the lever 109. Present in the widened central portion is a tag 119, formed on the plate 72 and bent at right angles, which constitutes a bearing for a shaft pin 121 on a lever 123 which forms part of the scale indicator lever system which also includes the lever 109. The plate 72 furthermore comprises an opening in which a bearing bush 125 for the shaft 127 of the tuning knob 69 is connected, and further openings (not visible in FIG. 6) for mounting further controls such as potentiometers and the like.

What is claimed is:

1. A pushbutton device for mechanical preselection tuning in radio receivers, comprising a frame, an adjusting member having a longitudinal axis, means for mounting said member for rotation in said frame about said axis, means for coupling to receiver tuning means responsive to the angular position of said adjusting member, first means for rotating said member in response to a tuning control, said first means comprising a slip clutch, and second means for rotating said member to a selected one of a number of preselected positions responsive to pushbutton operation, wherein said adjusting member and said slip clutch form portions of an elongated unit having two ends, said unit being rotatably journalled in said frame near said two ends, said slip clutch coupling between one of said ends and said adjusting member, such that upon rotation of said member by said second means only one journalled end of said unit rotates.

2. A device as claimed in claim 1, wherein said adjusting member has a longitudinal groove near one end and a transverse slot communicating with said groove, said first means comprising a stub shaft forming one of said ends of the elongated unit, said slip clutch comprising a yoke slidably fitted in said slot and biased into engagement with said shaft so as to retain said shaft in said groove, said stub shaft being rotatable with respect to said member with a given friction.

3. A device as claimed in claim 2, wherein said shaft has a circumferential groove; and said yoke comprises a plate having an elongated cut-out, V-shaped at one end and defining internal edges of said yoke, said internal V-shaped edges engaging said shaft in said groove; and said clutch further comprises a spring arranged to bias the yoke against the shaft and to exert a tilting force on the yoke such that the yoke engages an edge of said slot so as to prevent rotational backlash.

4. A device as claimed in claim 2, wherein said frame comprises an injection molding having two V-grooves for journalling the ends of the elongated unit, compartments for accommodating slide core tuning coils, guide grooves for pushbutton guide rods, guide grooves for core driving slides coupled to the adjusting member, guide grooves for a wave range switch slide, and a slide groove for scale indicator means.

* * * * *